United States Patent
Teer

(10) Patent No.: US 7,323,219 B2
(45) Date of Patent: Jan. 29, 2008

(54) APPARATUS AND METHOD FOR APPLYING DIAMOND-LIKE CARBON COATINGS

(75) Inventor: Denis Teer, Hartlebury (GB)

(73) Assignee: Teer Coatings Ltd, Hartlebury, Worcestershire (GB)

( * ) Notice: Subject to any disclaimer, the term of this patent is extended or adjusted under 35 U.S.C. 154(b) by 0 days.

(21) Appl. No.: 10/507,953

(22) PCT Filed: Mar. 14, 2003

(86) PCT No.: PCT/GB03/01078

§ 371 (c)(1),
(2), (4) Date: Feb. 16, 2005

(87) PCT Pub. No.: WO03/078679

PCT Pub. Date: Sep. 25, 2003

(65) Prior Publication Data

US 2005/0126486 A1    Jun. 16, 2005

(30) Foreign Application Priority Data

Mar. 14, 2002 (GB) ................................ 0205959.0

(51) Int. Cl.
*C23C 16/26* (2006.01)
(52) U.S. Cl. .............. 427/249.1; 118/723 E; 118/723 I; 204/192.15; 427/249.7; 427/249.15; 427/249.17; 427/255.23; 427/255.28; 427/577
(58) Field of Classification Search ........ 428/408, 428/698, 457; 118/723 E, 723 I; 427/249.1, 427/249.7, 249.15, 249.17, 255.23, 255.28, 427/255.395, 57.7; 204/192.15, 298.02, 204/298.12, 288.34
See application file for complete search history.

(56) References Cited

U.S. PATENT DOCUMENTS

| | | | | |
|---|---|---|---|---|
| 4,783,368 A | * | 11/1988 | Yamamoto et al. | 428/408 |
| 5,112,458 A | * | 5/1992 | Nakayama et al. | 204/173 |
| 5,249,554 A | * | 10/1993 | Tamor et al. | 428/698 |
| 5,308,707 A | * | 5/1994 | Cellier et al. | 427/249.1 |

(Continued)

FOREIGN PATENT DOCUMENTS

WO    WO 97 10688 A    3/1997

(Continued)

OTHER PUBLICATIONS

Schroeder et al "Titanium containing amorphous hydrogenated carbon films (a:C : H/Ti): surface analysis and evaluation of cellular reactions using bone marrow cell cultures in vitro", Biomaterials 21 (2000) 449-456.*

(Continued)

*Primary Examiner*—Archene Turner
(74) *Attorney, Agent, or Firm*—Head, Johnson & Kachigian

(57) ABSTRACT

The invention relates to a coating and apparatus and method for applying the same, said coating including Diamond Like Carbon (DLC) applied by chemical vapor deposition using a pulsed DC biased power supply, typically having an initial metal layer and followed by a transitional metal carbide layer and a DLC layer. The depths and transitions between the materials can be selected to suit requirements. The apparatus also includes the use of an arrangement with at least one electrode with an RF power supply and the selective control of the power supplies to the electrode and substrates is used to improve the efficiency of application.

12 Claims, 2 Drawing Sheets

U.S. PATENT DOCUMENTS

| | | | | |
|---|---|---|---|---|
| 5,382,274 | A | * | 1/1995 | Yamamoto et al. .......... 427/577 |
| 5,780,119 | A | * | 7/1998 | Dearnaley et al. ....... 427/249.7 |
| 5,930,077 | A | * | 7/1999 | Obata et al. ................. 427/577 |
| 5,965,216 | A | * | 10/1999 | Neuberger et al. .......... 427/577 |
| 6,083,570 | A | * | 7/2000 | Lemelson et al. .......... 427/577 |
| 6,143,142 | A | * | 11/2000 | Shi et al. ................ 204/192.15 |
| H1924 | H | * | 12/2000 | Zabinski et al. ........ 204/192.16 |
| 6,331,332 | B1 | * | 12/2001 | Wang .................. 427/255.395 |
| 6,465,057 | B1 | * | 10/2002 | Nakahigashi et al. ....... 427/577 |
| 6,740,393 | B1 | * | 5/2004 | Massler et al. ............. 428/408 |

FOREIGN PATENT DOCUMENTS

WO        WO 99 27893 A        6/1999

OTHER PUBLICATIONS

Donnet et al "Diamond-like carbon-based functionally gradient coatings for space tribology" Surface & Coatings Technology 120-121 (1999) 548-554.*

Kulikovsky et al "The mechanical, tribological and optical properties of Ti-C:H coatings, prepared by DC magnetron sputtering" Diamond & Related material 7 (1998) 774-778.*

Voevodin et al "Superhard, functionally gradient, nanolayered and nanocomposite diamond-like carbon coatings for wear protection" Diamond & Related Materials 7 (1998) 463-467.*

Voevodin et al "Design of a Ti/TiC/DLC functionally gradient coating based on studies of structural transitions in Ti-C thin films" Thin Solid Films 298 (1997) 107-115.*

Michler et al "DLC Films deposited by bipolar pulsed DC PACVD" Diamond & Related Material 7 (1998) 459-462.*

"DLC Films Deposited By Bipolar Pulsed DC PACVD", Michler et al, Diamond and Related Materials, Elsevier Science Publishers, Amsterdam, NL, vol. 7,No. 2-5.

"Ion-Assisted CVD of Graded Diamond Like Carbon (DLC) Based Coatings", Monaghan D. P et al, Journal De Physique IV, Editions De Physique, Les Ulis Cedex, FR, vol. 3, No. 8, Aug. 1, 1993.

Holland and Ojha publication in the Journal, Vacuum 26, p. 53 1975.

Grischke Bewilogua and Dimigen Materials and Manufacturing Processes 8(4&5) 407 1993.

* cited by examiner

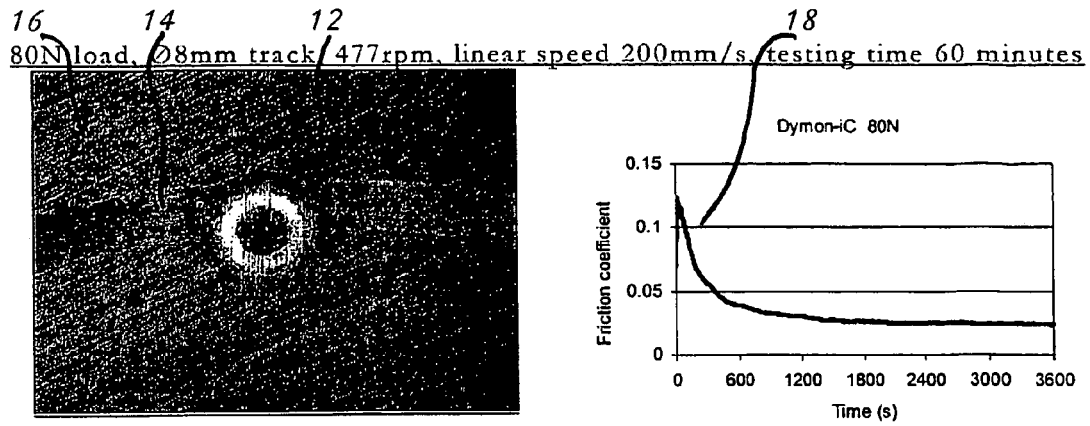
16 14 12 18
80N load, ⌀8mm track, 477rpm, linear speed 200mm/s, testing time 60 minutes
1 Wear - 0.3μm, Track width - 230μm
Figure 2a
Specific Wear Rate - $1.5 \times 10^{-17}$ $m^3/Nm$
Figure 2b
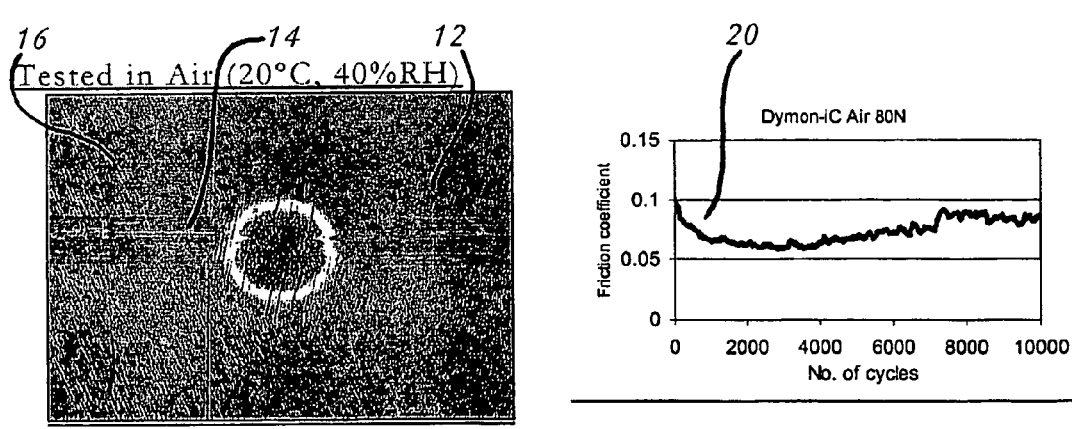
16 14 12 20
Tested in Air (20°C, 40%RH)
Wear - 0.6μm, Track width - 204μm
Figure 3a
Specific Wear Rate - $3.8 \times 10^{-17}$ $m^3/Nm$
Figure 3b

APPARATUS AND METHOD FOR APPLYING DIAMOND-LIKE CARBON COATINGS

CROSS-REFERENCE TO RELATED APPLICATION

This is the United States National Phase filing of PCT Application No. GB03/01078 (Publication No. WO 03/078679A1) filed 14 Mar. 2003 entitled "Apparatus And Method For Applying Diamond-Like Carbon Coatings" which claims priority to British Patent Application No. 0205959.0 filed 14 Mar. 2002.

BACKGROUND OF THE INVENTION

The invention to which this application relates is particularly although not necessarily exclusively, to apparatus and a method for the application of a type of coating known as a diamond-like carbon coating to a substrate surface.

Diamond-like carbon coatings are well known and properties of the same such as the hardness, wear resistance and the like are known. The current invention relates to an improvement in the application of a diamond-like carbon coating which further enhances the characteristics of the coating over and above the conventional coatings of this type. A further type of carbon coating is one which has a graphite-like structure which has a lower friction and much better wear resistance than diamond-like carbon coatings which include metal and retain the advantageous properties at high loads in that they have had exceptional load bearing capacity. One such coating is described in the applicant's co-pending application EP-1036208.

There are a number of different known ways of applying diamond-like carbon coatings to a substrate surface, each of which are used commercially with varying degrees of success and for particular applications. Thus particular types of application may be used to suit specific purposes and/or end uses of articles including the coating.

Typically, it is known to be possible to deposit a carbon coating with a diamond-like structure (hereinafter referred to as a diamond-like carbon coating), by creating a glow discharge to a substrate to be coated in a controlled atmosphere containing a hydrocarbon gas. The glow discharge causes a breakdown of the hydrocarbon gas and the carbon from said gas is deposited on the substrate. One well known embodiment of this method is to use an RF discharge on the substrate as described in the Holland and Ojha publication in the Journal, Vacuum 26, page 53 1975.

There are many variations on this method and, by controlling the deposition parameters, the diamond-like carbon coating which is achieved can have variations in characteristics and properties to suit specific uses. Indeed, discharges other than an RF discharge can be used, the power and voltage applied can be varied, differing hydrocarbon gases can be used and/or mixed with other gases such as argon and hydrogen and thus it will be seen that the variation of various parameters of the coating method can be controlled to provide the required end result.

While the application of this type of coating in accordance with this method can be successful in terms of the hardness of the coating, the diamond-like carbon coatings have been found to be relatively brittle and achieving adhesion of the coating to the substrate surface is found to be difficult to achieve to any significant degree.

Conventionally, in order to attempt to overcome these problems, modifications to the deposition procedure and method have been made. One change has been to deposit a small amount of metal along with the carbon from the gas. One such method is described in the document Grischke Bewilogua and Dimigen "Materials and Manufacturing Processes 8(4&5) 407 1993". The presence of the metal is found to reduce the internal stresses of the coating when applied and, as a result, produces a less brittle coating. However it also reduces the hardness of the coating.

For the application of diamond-like coatings containing metal in a coating chamber, RF power is applied to the substrate to be coated and this serves to break down the hydrocarbon gas in the vicinity of the substrate and so deposit the diamond-like coating on the substrate surface. At the same time, metal is deposited by sputtering from a metal target onto the substrate and hence the coating which is achieved has a diamond-like carbon coating property with metal incorporated therein. However, there are known to be a number of disadvantages to this method in that it is necessary to use a matching network and tuner to reduce the reflected power from the RF power supply and, for large scale deposition systems, the RF power supply, with the associated matching network and tuner, are expensive and have reliability problems as well as convenience problems when compared to the use of DC power supplies.

For example, it is necessary to provide extensive shielding to prevent damaging leakage of the RF power in the chamber and the matching network required has to be able to provide a wide range of impedance values corresponding to the wide range of substrate loads in the coating chamber and so RF power supply deposition methods are conventionally regarded as being inconvenient for a large scale coating system. Furthermore, when RF power is applied to the substrate there is no ability to control, independently, two deposition parameters, namely the voltage applied to the substrates and the ion current drawn by the substrates.

Despite the disadvantages, RF power is typically used, as the diamond-like carbon coatings are electrically insulating. Conventionally, if DC power is to be used then the coating is required to be conducting. This can be achieved by including a higher metal content in the coating but this type of coating has less desirable properties than the RF deposited metal containing Diamond Like Coating (DLC).

SUMMARY OF THE INVENTION

The aim of the present invention is to provide an improved method and apparatus for depositing diamond-like carbon coatings with tribological properties superior to conventional diamond-like carbon coatings and preferably which have similar characteristics to those of the graphite-like structure carbon coatings.

In a first aspect of the invention there is provided a method for the formation of a diamond-like carbon coating on at least one substrate, said method comprising the steps of supplying a hydrocarbon gas into the vicinity of the substrate, applying a pulsed DC biased power supply to the substrate to cause the break up of the hydrocarbon gas structure and the application of carbon from said gas onto said substrate to form a diamond-like carbon coating thereon.

In one embodiment, the method can further include the step of depositing a metal onto said substrate surface so as to form a diamond-like carbon coating including a metal therein. Typically the metal is deposited simultaneously with the deposition of the carbon from the hydrocarbon gas, but, as required, the application of the metal can be controlled separately and independently from the carbon, thereby allowing, if required, carbon only coatings or portions of the coatings to be applied.

Typically the hydrocarbon gas is introduced into a controlled deposition chamber in which the substrates are held.

Preferably, the pulsed DC bias voltage applied to the substrates and the ion current drawn by the substrates are independently controlled. In one embodiment the independent control is achieved by the utilisation of at least one electrode in the deposition chamber in which the substrate is located. Typically an RF power supply is connected to said electrode to enhance the discharge of the pulsed DC bias on the substrates to change the impedance of the glow discharge.

In a further aspect of the invention, there is provided apparatus for the deposition of a diamond-like carbon coating onto a substrate, said apparatus comprising a deposition chamber in which the at least one substrate is mounted, a means for introducing hydrocarbon gas into said deposition chamber, at least one metal target, deposition means to allow the metal to be deposited onto said substrate, and a means for applying a pulsed DC bias voltage to said at least one substrate and characterised in that the at least one electrode is positioned in the deposition chamber and acted upon by an RF power supply.

In one embodiment the apparatus includes two or more electrodes which are acted upon by the RF power supply.

In further aspects of the invention there are provided a coating and an article including a coating, said coating formed using the method and/or apparatus as herein described.

DESCRIPTION OF THE DRAWINGS

A specific embodiment of the invention is now described with reference to the accompanying drawings, wherein:—

FIGS. 2A and B illustrate performance characteristics of coating produced in accordance with one embodiment of the invention tested using a pin on disc test; and FIGS. 3A and B illustrate characteristics of a coating applied in accordance with the embodiment of FIGS. 2A and B tested using a reciprocating test.

DESCRIPTION OF THE PREFERRED EMBODIMENTS

Figure 1:
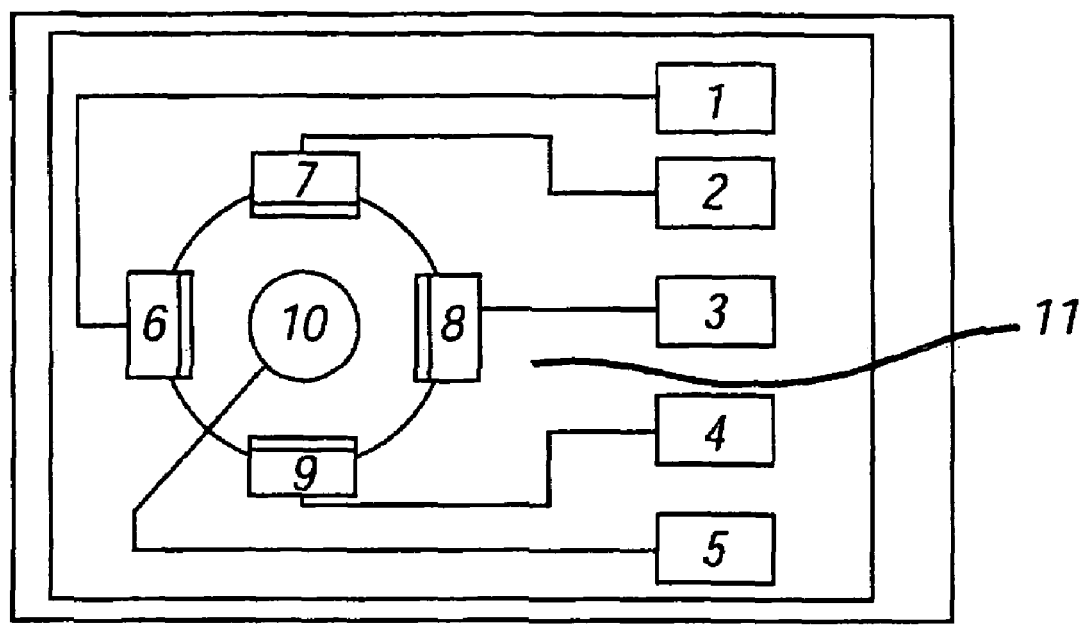
FIG. 1 illustrates a deposition apparatus in accordance with one embodiment of the invention.

Referring firstly to FIG. 1, there is illustrated one embodiment of a sputter ion plating system adapted in accordance with this invention and including sputter magnetrons and at least one electrode in a closed field in a coating chamber 11 as a closed field sputter ion plating system. The magnetron sputtering part of the apparatus is similar to that described in detail in the applicant's patent GB2258347.

FIG. 1 illustrates the system in schematic manner with there being provided a DC power supply 1 connected to the magnetron 6. In addition, there is also provided an RF power supply 2 connected to electrode 7 in accordance with the invention. A further DC power supply 3 is provided for magnetron 8 and a DC supply 4 is provided for magnetron 9. A pulsed DC power supply 5 is provided to apply the pulsed DC power supply to the substrates on the substrate holder 10.

In this example the magnetrons are provided with chromium targets to allow the application of chromium as part of the coating, mainly to provide the adhesion layer with the substrate, but also as a possibility of including the metal as a part of the carbon coating as will be described.

In this embodiment, a hydrocarbon gas is introduced into the deposition chamber and in this case the gas is butane. Other hydrocarbon gasses can be used and parameters such as rates of deposition and thickness of the coatings in different stages of deposition can be varied to suit particular requirements although, in terms of changing the properties of the coating, any parameter changes are performed gradually in order to avoid abrupt changes in the mechanical properties of the coating.

The electrode with RF power supply is provided and operated in a manner which will now be described, to allow the enhancement of the plasma created in the vicinity of the substrates and hence improve the characteristics of the coating which is applied.

In operation, the RF power is applied to the electrode to enhance the discharge of the pulsed DC bias on the substrate, to change the impedance of the glow discharge of the substrate on the substrate holder 10. The ability to change the impedance of the pulsed DC discharge means that, after setting the voltage of the pulsed DC power applied to the substrates, the ion current drawn by the substrates is varied by altering the level of RF power 2 applied to the electrode 7. Thus, there is provided independent control of the bias voltage and current by changing the RF power applied to the electrode 7. The RF power applied to the electrode has none of the disadvantages of the conventional systems for the application of RF power to the substrates as only a relatively low RF power is applied, even for a large scale coating system. Low RF power supplies are more reliable than the larger level RF power supplies and as a result the matching network for the power supply uses more robust and cheaper components. Thus, the electrode is provided of constant size and shape and the matching network and tuner, once set, needs no further adjustment.

A specific embodiment of the invention is now provided and, the power levels herein given relate to apparatus with a chamber of 850 mm height and 750 mm diameter with the magnetron electrodes 700 mm long and 175 mm wide.

The operating method which is performed involves the following steps. Firstly, the deposition chamber 11 is pumped to below $5\times10^{-5}$ torr pressure whereupon argon is introduced into the chamber through a mass flow valve and set at around 30 sccm which results in a chamber pressure of around $3\times10^{-3}$ torr. The pulsed DC bias supply 5 is connected to the typically rotatable substrate holder with the substrates energised and set at about −400V. A pulse frequency of about 250 µs and a pulse width of about 1.5 ns are used although these settings can be varied to suit particular coating requirements.

The DC power supplies 1,3,4 are connected to the magnetrons 6,8,9 respectively and energised and set to about 0.6 Amps with the above conditions resulting in efficient ion cleaning of the substrates and typically lasting for approximately 20 minutes.

When the cleaning process is completed the voltage of the power supply is reduced to about −100 Volts and the current settings of the DC supplies increased to 6 Amps. During this time, which lasts approximately 5 minutes, there is applied from the magnetrons a metal to form a metallic layer, typically but not exclusively of chromium to a depth of approximately 0.1 to 0.2 µm. This acts as an adhesion layer between the coating and substrate surface.

When the application of the metal layer is completed, the voltage applied to the substrates (10) is reduced to about −40 Volts and butane is introduced into the chamber, the level of which is controlled by optical emission close loop feedback to a piezoelectric valve. The percentage of the metal which is to be used to form part of the coating is set at 60% and the current settings are maintained at 6 Amps. During this stage chromium is deposited onto the substrates along with carbon from the butane gas. This stage typically lasts around 45 minutes and results in a chromium carbide layer of approximately 1 µm depth. At the end of this stage, butane is introduced through a mass flow valve and the level of butane is increased from zero to around 30 sccm, typically over a period of 20 minutes and during this time the piezoelectric valve closes automatically due to the input of butane through the mass flow valve. When the maximum gas flow rate has been reached, the parameters remain constant and at this time the RF power supply 2 which is connected to the electrode 7 is energised. The RF power which is applied is increased to 300 Watts over a period of at least 30 minutes and during this period of time the DC currents to the magnetron 6, 8, 9 applied are reduced to zero so that there is no metal deposition and hence no metal content in the final or outer layer of the coating, and the bias voltage is increased to around to −100 Volts. This final stage lasts approximately 60 minutes and results in a layer thickness of about 1 µm. It is possible to maintain some power to the targets in the final stage if it is desired that the outer layer of the coating includes some metal.

As a result of following the process so described, a coating is achieved on the substrate which possesses excellent structure and properties and, if the final layer is greater than approximately 0.8 µm the coating is black in appearance, is electrically insulating and smooth. The structure of the coating itself is amorphous inasmuch that the metal and carbon can be, if required, formed as an integral coating, although typically including no or less quantities of metal than that of carbon. This composition can be adjusted to suit specific requirements. Typically the metal layer is always first applied to improve adhesion of the coating to the substrate surface.

The example as herein described therefore provides an excellent coating to suit many purposes. However it should be appreciated that the coating characteristics can be altered to suit requirements by adjustment of certain parameters of the coating system. For example, a higher bias voltage level produces a coating with a higher hardness level than that of the example given.

In one embodiment, typical thicknesses of the various stages of the coating are as follows:—
  Metal (Chromium) interlayer on substrate of approximately 0.1 µm
  Metal (Chromium) Carbide of approximately 1 µm
  Ramp layer metal (chromium) carbide grading to DLC of approximately 0.7 µm
  DLC layer containing no or reduced metal content of approximately 1 µm The hardness of the coating is dependent on the exact deposition parameters but in order to give optimum tribological properties at very high loading, the parameters described can be used and the coating has a plastic hardness of about 1,400 kg/mm$^2$.

It should be added that it is preferred that in the transition between metal carbide and DLC layers, at least, there is provided a transition period during which there is a gradual adjustment of parameters so as to enable a transitional amorphous coating to be achieved and therefore limit or minimise any stressed or fractures in the coating.

The adhesion of the coating is also an important feature and is measured by a scratch test using a 200 µm diamond. The first adhesion failure occurs above 60N with some minor chipping recorded at 30N to indicate some cohesion failure.

The most remarkable feature of this coating is its very low wear and extremely high load and typical results from a pin and on disc test are illustrated in FIGS. 2a and b.

In these figures the coating 12 was deposited on an M42 high speed steel substrate hardened to 850VHN. The pin used was a 5 mm diameter WC/Co and the tests were carried out in air at about 40% relative humidity. FIGS. 2a and b show the specific wear rate obtained from the measurement of the coating thickness in the wear track 14 and outside the wear track 16 using a ball crater taper section method. The specific wear rate obtained of $1.5 \times 10^{-17}$ m$^3$/Nm is lower than the wear rate of any conventional DLC known to have been tested. Furthermore, no other DLC will withstand an 80N load and will usually fail within about 1 minute of application of the load.

A bi-directional wear test performed on the coating using a 5 mm WC/Co ball at 80N load, with 150 mm/min. linear of velocity, 2 mm linear displacement, and over 10,000 cycles and tests in air of 20° C. and 40% RH provided the results shown in FIGS. 3a and b. Further reciprocating wear tests, but using 5 mm balls of soft metals, as the counterface pin (replacing the WC/Co ball) indicated low galling and pick-up from the soft metals. Metals tested include aluminium, copper, titanium, gold and silver.

FIG. 2b shows a wear track and friction trace 18 from a pin on disc test. FIG. 3b shows a wear track and friction trace 20 from a reciprocating wear test.

The examples of the method and apparatus of the invention described are provided to illustrate the advantageous features of the invention but the examples do not restrict the wider scope of the invention such that alteration to the method parameters can be made to generate coatings within the inventive concept but having specified properties. Furthermore the apparatus can include, particularly for larger systems, two or more RF electrodes to improve the efficiency of the same.

The low friction and wear properties make the coating suitable for a large range of applications such as forming tools, dies, moulds, punches, for non-ferrous work piece materials in particular; cutting tools, drills, milling cutters, taps for non-ferrous work piece materials, cold extrusion dies, protecting motor engine parts, gudgeon pins, cam followers, piston rings, injector nozzles, vacuum pickup nozzles and the coating is also suitable for use as a decorative shiny black coating for items such as watch straps.

The present method therefore successfully addresses the disadvantages and inconvenience of conventional RF methods for applying DLC coatings and allows the independent control of the bias voltage and bias ion current. High quality electrically insulating DLC coatings can be deposited without using RF bias on the substrate and, because independent control of the bias voltage and ion current is possible, the properties of the coating can be optimised and are much improved as compared to previous conventional metal containing or non-metal containing DLC coatings.

While the invention has been described with a certain degree of particularly, it is manifest that many changes may be made in the details of construction and the arrangement of components without departing from the spirit and scope of this disclosure. It is understood that the invention is not limited to the embodiments set forth herein for purposes of exemplification, but is to be limited only by the scope of the attached claim or claims, including the full range of equivalency to which each element thereof is entitled.

The invention claimed is:

1. A method for the formation of a diamond-like carbon coating on at least one substrate within a deposition chamber, said method comprising the steps of:
   depositing material from at least one magnetron to deposit an adhesion layer of the material onto the at least one substrate;
   supplying a hydrocarbon gas into the vicinity of the at least one substrate;
   applying a pulsed DC biased power supply to the at least one substrate to cause the break up of the hydrocarbon gas structure, said pulsed DC biased power supply controlled with respect to an ion current drawn by the at least one substrate;
   applying carbon from said hydrocarbon gas onto said adhesion layer on said at least one substrate to form a diamond-like carbon coating thereon; and
   selectively applying an RF power supply to at least one electrode provided in the deposition chamber in which the at least one substrate is located.

2. A method according to claim 1 wherein a metal is deposited from said at least one magnetron onto said adhesion layer to form a diamond-like carbon coating including a metal therein.

3. A method according to claim 2 wherein the metal is deposited simultaneously with the deposition of the carbon from the hydrocarbon gas.

4. A method according to claim 3 wherein the deposition of the metal is controlled separately and independently from the control means for the application of the carbon.

5. A method according to claim 2 wherein the deposition of the metal is controlled separately and independently from control means for the application of the carbon.

6. A method according to claim 1 wherein the hydrocarbon gas is introduced into a controlled deposition chamber in which the at least one substrate is held, firstly in conjunction with the deposition of metal and thereafter with no metal deposition.

7. A method according to claim 1 wherein an RF power supply is connected to said at least one electrode to enhance discharge of the pulsed DC bias on said at least one substrate to change impedance of a glow discharge.

8. A coating formed using the method of claim 1 said coating including at least a layer of carbon containing a metal, applied onto said adhesion layer.

9. A method according to claim 1 wherein said at least one magnetron is operated to apply an adhesion layer of material onto said at least one substrate and said pulsed DC bias voltage and RF power supply to said at least one electrode are independently controlled to cause a coating having insulating characteristics to be applied to said at least one substrate in the deposition chamber.

10. An apparatus for the deposition of a diamond-like carbon coating onto at least one substrate, said apparatus comprising:
    a deposition chamber in which at least one substrate is mounted;
    a means for introducing hydrocarbon gas into said deposition chamber;
    at least one metal target and magnetron deposition means to allow metal from the target to be deposited onto said at least one substrate;
    a means for applying a pulsed DC bias voltage to said at least one substrate; and
    at least one electrode positioned in the deposition chamber having an RF power supply connected thereto.

11. An apparatus according to claim 10 further including two or more electrodes which are acted upon by an RF power supply.

12. An apparatus according to claim 10 wherein a DC power supply is provided to the deposition means and the application of the DC power supply and RF supply is selective during the application of the coating.

* * * * *